United States Patent
Ruffell et al.

(10) Patent No.: US 9,984,889 B2
(45) Date of Patent: May 29, 2018

(54) TECHNIQUES FOR MANIPULATING PATTERNED FEATURES USING IONS

(71) Applicant: Varian Semiconductor Equipment Associates, Inc., Gloucester, MA (US)

(72) Inventors: Simon Ruffell, South Hamilton, MA (US); Huixiong Dai, San Jose, CA (US); Jun Lang, Union City, CA (US); John Hautala, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days. days.

(21) Appl. No.: 15/142,526

(22) Filed: Apr. 29, 2016

(65) Prior Publication Data
US 2017/0263460 A1    Sep. 14, 2017

Related U.S. Application Data

(60) Provisional application No. 62/305,308, filed on Mar. 8, 2016.

(51) Int. Cl.
*H01L 21/311*    (2006.01)
*H01L 21/3065*    (2006.01)
(Continued)

(52) U.S. Cl.
CPC ...... *H01L 21/3065* (2013.01); *H01L 21/3085* (2013.01); *H01L 21/76879* (2013.01); *H01L 21/76883* (2013.01)

(58) Field of Classification Search
None
See application file for complete search history.

(56) References Cited

U.S. PATENT DOCUMENTS

| 4,484,979 A | 11/1984 | Stocker |
| 4,680,085 A | 7/1987 | Vijan et al. |

(Continued)

FOREIGN PATENT DOCUMENTS

| JP | 09-120954 A | 5/1997 |
| JP | 2006054317 A | 2/2006 |

(Continued)

OTHER PUBLICATIONS

International Search Report and Written Opinion dated Jun. 19, 2017 for PCT/US2017/020909 filed Mar. 6, 2017.

(Continued)

*Primary Examiner* — Calvin Choi

(57) ABSTRACT

A method may include providing a surface feature on a substrate, the surface feature comprising a feature shape a feature location, and a dimension along a first direction within a substrate plane; depositing a layer comprising a layer material on the surface feature; and directing ions in an ion exposure at an angle of incidence toward the substrate, the angle of incidence forming a non-zero angle with respect to a perpendicular to the substrate plane, wherein the ion exposure comprises the ions and reactive neutral species, the ion exposure reactively etching the layer material, wherein the ions impact a first portion of the surface feature and do not impact a second portion of the surface feature, and wherein an altered surface feature is generated, the altered surface feature differing from the surface feature in at least one of: the dimension along the first direction, the feature shape, or the feature location.

17 Claims, 9 Drawing Sheets

(51) Int. Cl.
*H01L 21/308* (2006.01)
*H01L 21/768* (2006.01)

(56) References Cited

U.S. PATENT DOCUMENTS

| | | |
|---|---|---|
| 6,414,366 B1 | 7/2002 | Kamijima |
| 6,787,052 B1 | 9/2004 | Vaganov |
| 7,767,977 B1 | 6/2010 | Godet et al. |
| 7,790,621 B2 | 9/2010 | Wen |
| 8,101,510 B2 | 1/2012 | Godet et al. |
| 8,288,741 B1 | 10/2012 | Miller et al. |
| 8,339,752 B1 | 12/2012 | Hattori et al. |
| 2006/0166419 A1 | 7/2006 | Shimoyama et al. |
| 2007/0051622 A1 | 3/2007 | Tang et al. |
| 2008/0002749 A1 | 1/2008 | Scherer et al. |
| 2008/0019408 A1 | 1/2008 | Behfar |
| 2008/0233691 A1 | 9/2008 | Cheng et al. |
| 2009/0023098 A1 | 1/2009 | Jain et al. |
| 2009/0084757 A1 | 4/2009 | Erokhin et al. |
| 2009/0250430 A1 | 10/2009 | Zhang |
| 2010/0252531 A1 | 10/2010 | Godet et al. |
| 2011/0021027 A1 | 1/2011 | Johnson |
| 2011/0114851 A1 | 5/2011 | Purser et al. |
| 2011/0248326 A1 | 10/2011 | Kanakasabapathy et al. |
| 2013/0328157 A1 | 12/2013 | Cheng et al. |
| 2014/0017817 A1* | 1/2014 | Godet .................. H01L 43/12 438/3 |
| 2014/0080276 A1 | 3/2014 | Brand et al. |
| 2014/0091394 A1 | 4/2014 | Li et al. |
| 2014/0357080 A1 | 12/2014 | Lisi et al. |
| 2015/0083581 A1* | 3/2015 | Sherman ............ H01L 21/3065 204/192.34 |
| 2015/0118604 A1 | 4/2015 | Dynes et al. |
| 2015/0311073 A1 | 10/2015 | Srinivasan et al. |

FOREIGN PATENT DOCUMENTS

| | | |
|---|---|---|
| KR | 10-2006-0078440 | 7/2006 |
| KR | 1020150015130 A | 2/2015 |
| WO | 0058953 A2 | 10/2000 |
| WO | 2014110379 A1 | 7/2014 |

OTHER PUBLICATIONS

Jin-Kwan Lee et al., Oblique-Directional Plasma Etching of Si Using a Faraday Cage, Journal of the Electrochemical Society, 2009, D222-D225, 156 (7), The Electrochemical Society.

Steve R. Sherman, et al., Replacement Metal Gate Transistor, US non provisional U.S. Appl. No. 13/921,731, filed Jun. 19, 2013.

Steve R. Sherman, et al., Process Flow for Replacement Metal Gate Transistors, US non provisional U.S. Appl. No. 13/921,717, filed Jun. 19, 2013.

International Search Report and Written Opinion Mailed Jan. 8, 2015 for PCT/US2014/057205 Filed Sep. 24, 2014.

International Search Report and Written Opinion mailed Aug. 30, 2016 in corresponding international patent application No. PCT/US2016/035417.

Xin Sun, et al., Selective Enhancement of SiO2 Rate by Ar-Ion Implantation for Improved Etch Depth Control, Electrochemical and Solid-State Letters, 2007, pp. D89-D91, vol. 10. Issue 9, The Electrochemical Society.

R. Charvel et al., Etch Rate Modification of SiO2 by Ion Damage, Electrochemical and Solid State Letters, 2006, pp. G245-G247, vol. 9, Issue 7, The Electrochemical Society.

James C. North. et al., Tapered Windows in Phosphorus-Doped SiO2 by Ion Implantation, IEEE Transactions on Electron Devices, 1978, pp. 809-812, vol. Ed-25, IEEE.

Avishai Ofan, et al., Origin of Highly Spatially Selective Etching in Deeply Implanted Complex Oxides, Applied Physics Letters, 2008, pp. 181906-1 to181906-3, vol. 93, On-line publishing.

\* cited by examiner

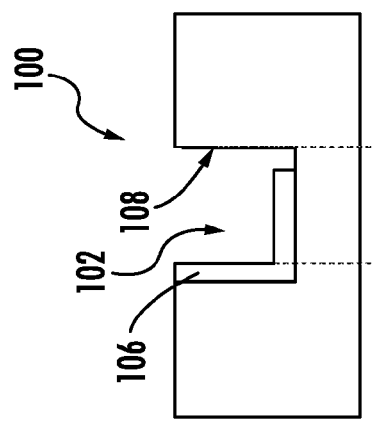
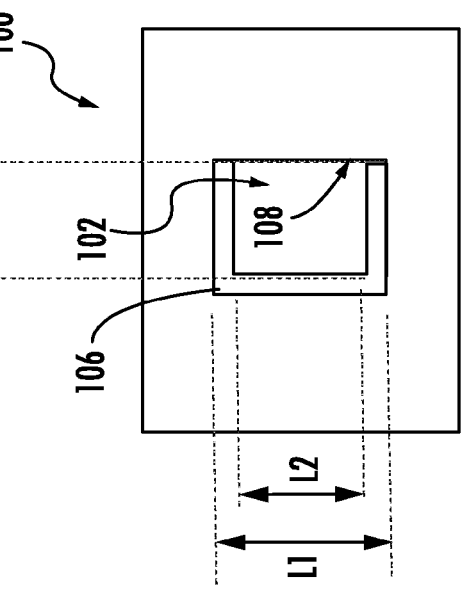
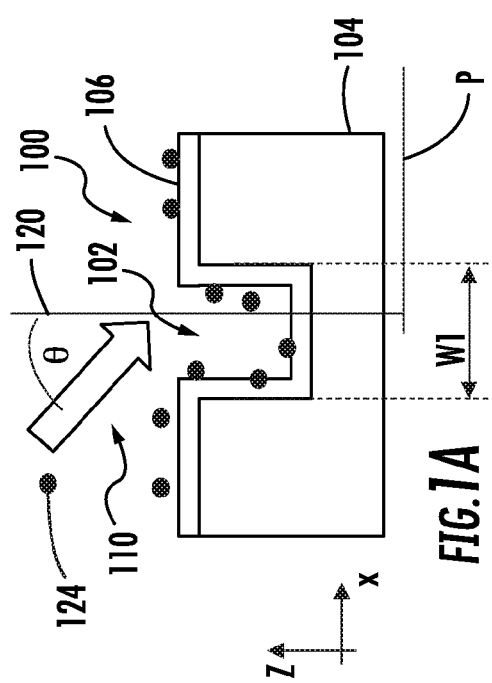
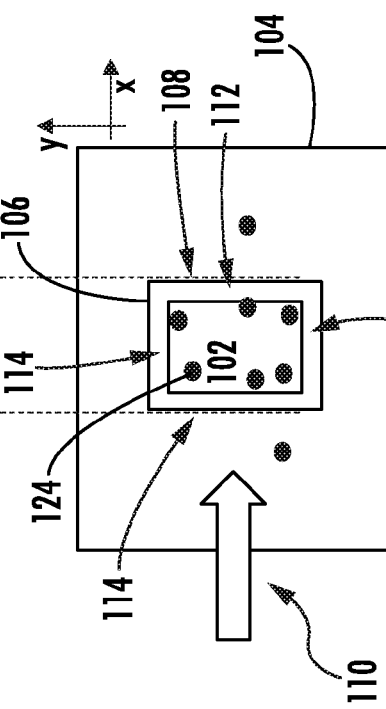

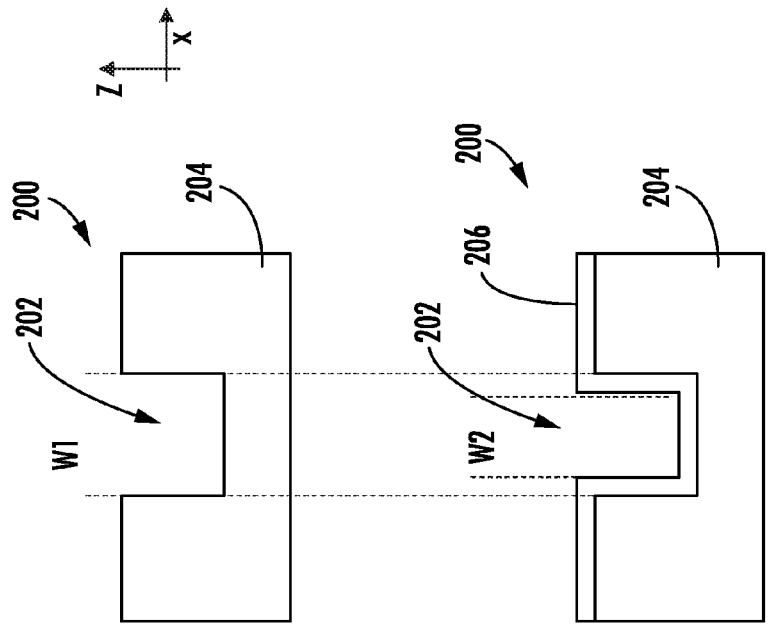

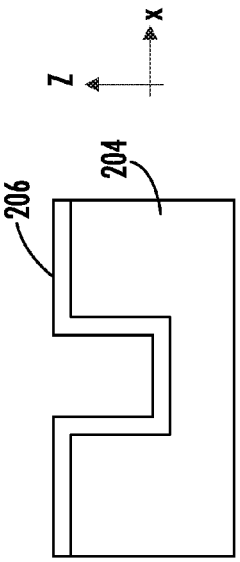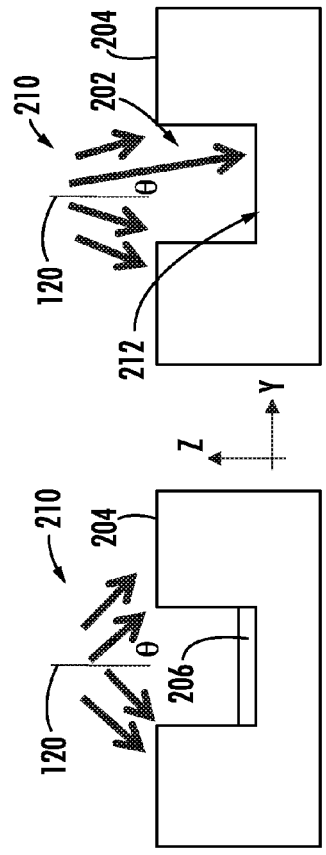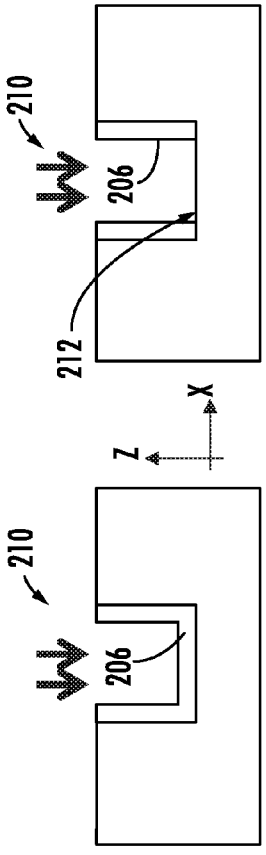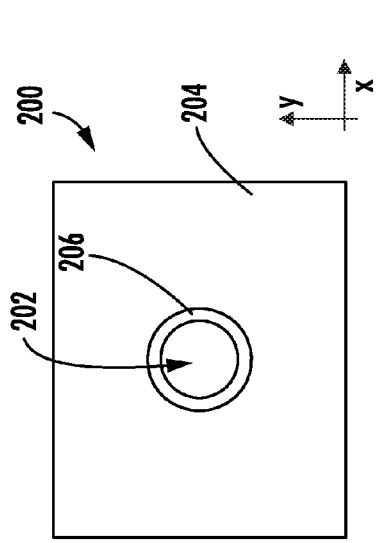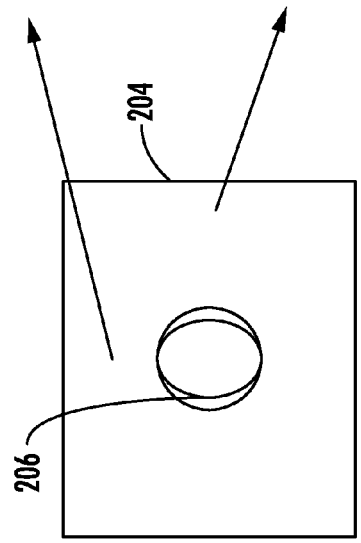
FIG. 3A  FIG. 3B  FIG. 3D  FIG. 3E  FIG. 3F  FIG. 3G  FIG. 3C

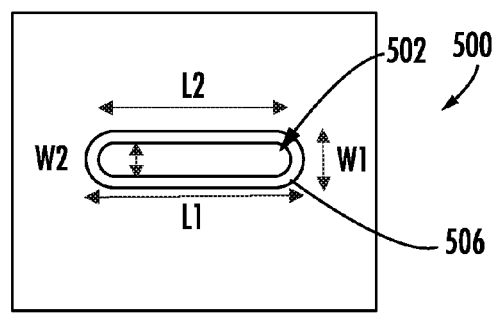
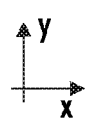
FIG. 5A
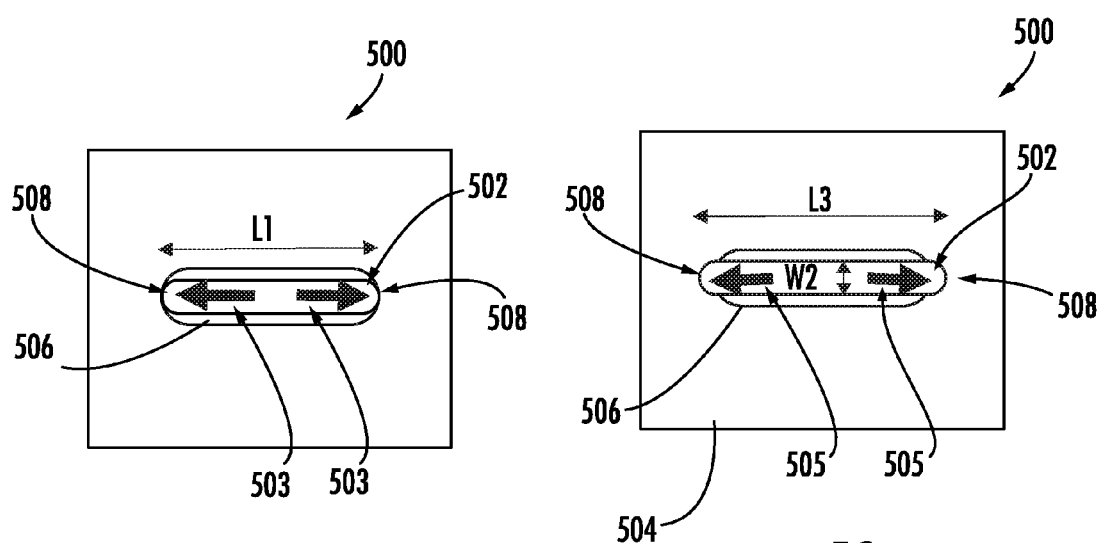
FIG. 5B
FIG. 5C

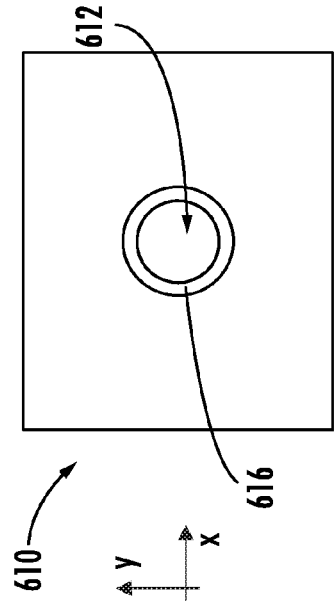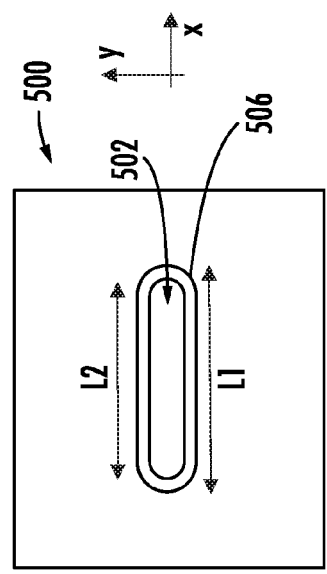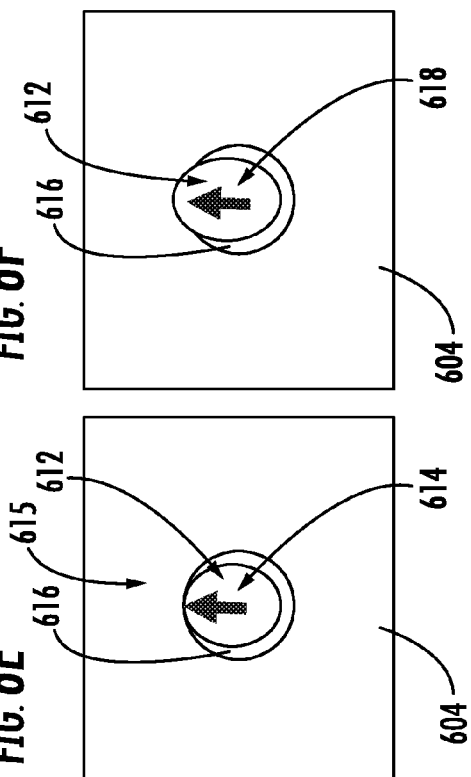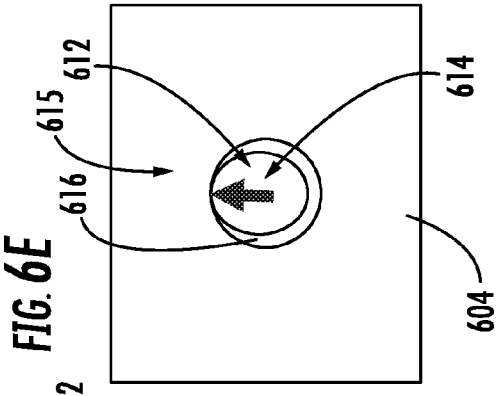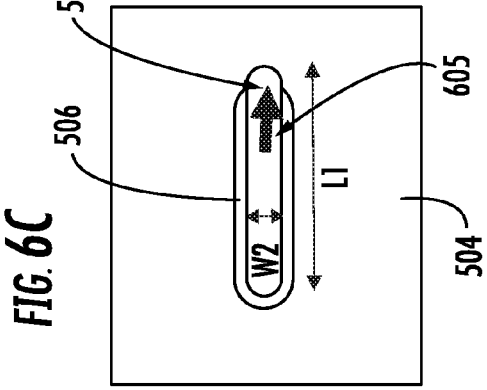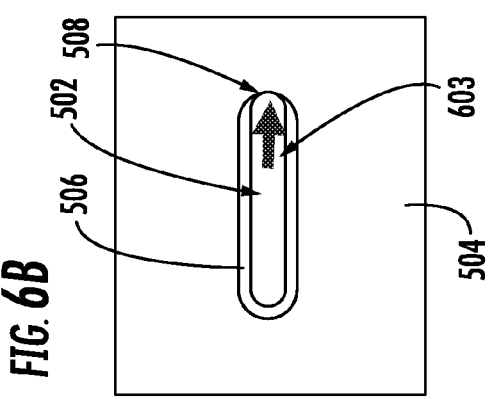

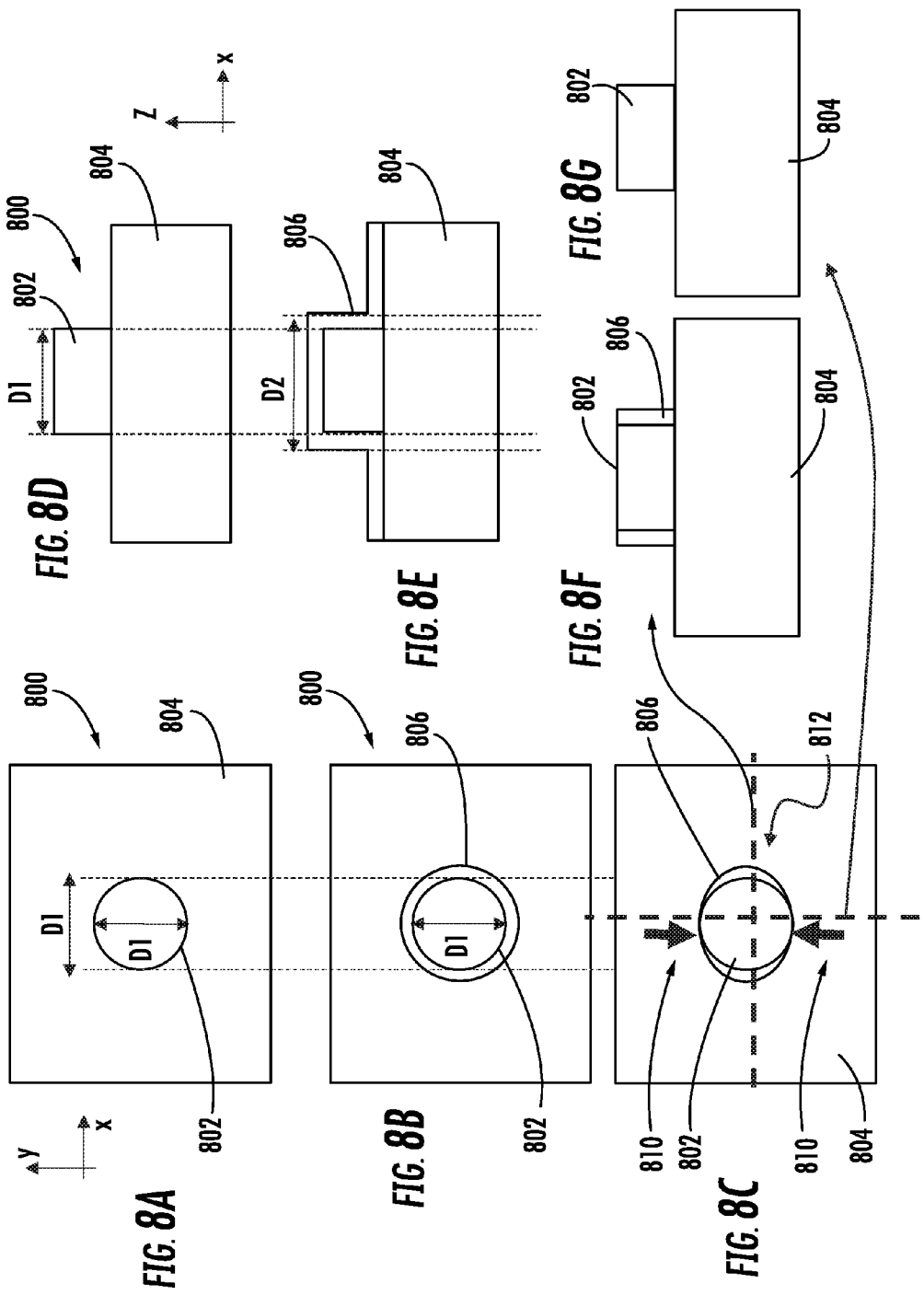

TECHNIQUES FOR MANIPULATING PATTERNED FEATURES USING IONS

RELATED APPLICATIONS

This application claims priority to U.S. Provisional patent application No. 62/305,308, filed Mar. 8, 2016, and incorporated by reference herein in its entirety.

FIELD

The present embodiments relate to transistor processing techniques, and more particularly, to processing for three dimensional device formation.

BACKGROUND

As semiconductor devices continue to scale to smaller dimensions, the ability to pattern features becomes increasingly difficult. These difficulties include in one aspect the ability to obtain features at a target size for a given technology generation. Another difficulty is the ability to obtain the correct shape of a patterned feature, as well as the correct placement of a patterned feature.

With respect to these and other considerations the present improvements may be useful.

BRIEF SUMMARY

In one embodiment, a method may include providing a surface feature on a substrate, the surface feature comprising a feature shape a feature location, and a dimension along a first direction within a substrate plane; depositing a layer comprising a layer material on the surface feature; and directing ions in an ion exposure at an angle of incidence toward the substrate, the angle of incidence forming a non-zero angle with respect to a perpendicular to the substrate plane, wherein the ion exposure comprises the ions and reactive neutral species, the ion exposure reactively etching the layer material, wherein the ions impact a first portion of the surface feature and do not impact a second portion of the surface feature, and wherein an altered surface feature is generated, the altered surface feature differing from the surface feature in at least one of: the dimension along the first direction, the feature shape, or the feature location.

In another embodiment, a method of processing a substrate may include providing a cavity in the substrate, the cavity having a first dimension along a first direction within a substrate plane and a second dimension along a second direction within the substrate plane, the second direction being perpendicular to the first direction; depositing a layer comprising a layer material within the cavity; and directing ions in an ion exposure at an angle of incidence toward the substrate, the angle of incidence forming a non-zero angle with respect to a perpendicular to the substrate plane; wherein the ion exposure comprises the ions and reactive neutral species, the ion exposure reactively etching the layer material, wherein the ions impact a first portion of the cavity and do not impact a second portion of the cavity, and wherein the first dimension is selectively altered with respect to the second dimension.

In a further embodiment, a method of processing a substrate may include providing a cavity in the substrate, the cavity disposed at a first cavity location within the substrate; depositing a layer comprising a layer material within the cavity; and directing ions in an ion exposure at an angle of incidence toward the substrate, the angle of incidence forming a non-zero angle with respect to a perpendicular to the substrate plane; wherein the ion exposure comprises the ions and reactive neutral species, the ion exposure reactively etching the layer material, wherein the ions impact a first portion of the cavity and do not impact a second portion of the cavity, and wherein the cavity is disposed at a second cavity location in the substrate after the ion exposure.

BRIEF DESCRIPTION OF THE DRAWINGS

FIGS. 1A-1D depict one example of processing of a device structure according to various embodiments of the disclosure;

FIGS. 2A-2D depict another example of processing of a device structure according to embodiments of the disclosure;

FIGS. 3A-3G depict processing of a device structure according to further embodiments of the disclosure;

FIGS. 5A-5C show processing of a device structure according to additional embodiments of the disclosure;

FIGS. 6A-6F illustrate processing of a device structure according to still other embodiments of the disclosure;

FIGS. 8A-8G another example of processing a device according to some additional embodiments of the disclosure;

DETAILED DESCRIPTION

Figure 4A:
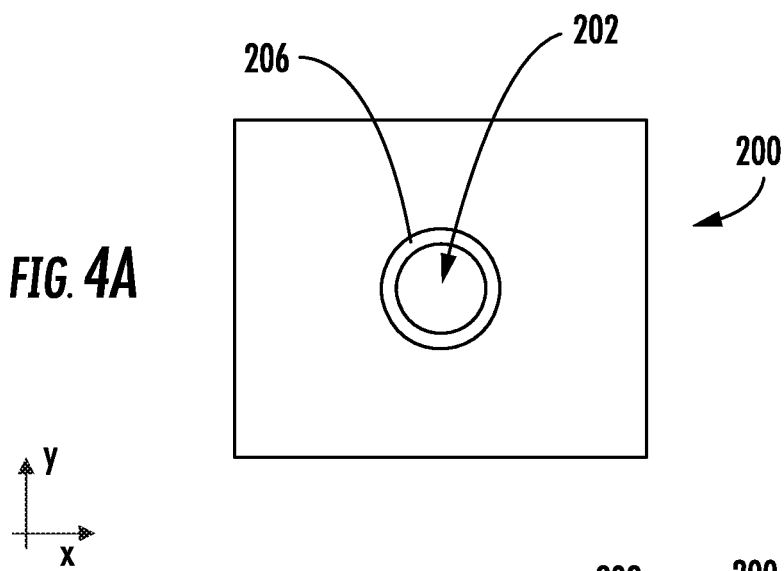
FIGS. 4A-4B depict processing of a device structure according to other embodiments of the disclosure.
Figure 4B:
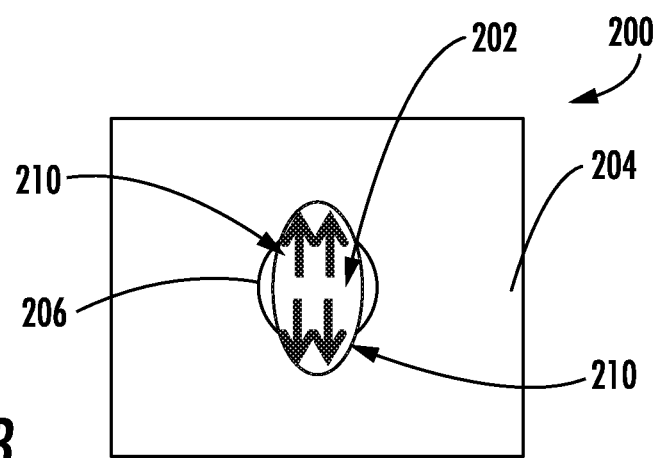

The present embodiments will now be described more fully hereinafter with reference to the accompanying drawings, where some embodiments are shown. The subject matter of the present disclosure may be embodied in many different forms and are not to be construed as limited to the embodiments set forth herein. These embodiments are provided so this disclosure will be thorough and complete, and will fully convey the scope of the subject matter to those skilled in the art. In the drawings, like numbers refer to like elements throughout.

This present embodiments provide novel techniques to pattern substrates and in particular novel techniques to modify a feature disposed on a substrate surface or extending from a substrate surface into the substrate. As used herein the term "substrate" may refer to an entity such as a semiconductor wafer, insulating wafer, ceramic, as well as any layers or structures disposed thereon. As such, a surface feature, layer, series of layers, or other entity may be deemed to be disposed on a substrate, where the substrate may represent a combination of structures, such as a silicon wafer, oxide layer, and so forth.

In various embodiments, the surface feature may be used for patterning a layer disposed underneath the surface feature. Examples of a surface feature include a hole formed within a layer, such as a via, or trench. In other examples a surface feature may be a pillar, a mesa structure, a line structure (line), or other feature extending above a substrate. The term "hole" may refer to a structure extending through the entirety of a layer, such as a via. The term "hole" may also refer to a structure such as a depression or recess formed within a layer not extending through the entirety of the thickness of a layer. Moreover, the term "layer" as used herein may refer to a continuous layer, a semicontinuous layer having blanket regions and regions of isolated features, or a group of isolated features generally composed of the same material and disposed on a common layer or substrate.

In various embodiments, techniques are provided to modify a surface feature or surface features. The techniques may be applied to the surface features after lithography processing is performed to form the surface feature(s). In various embodiments, the surface feature may be defined in photoresist, a hard mask material such as oxide, nitride, or carbon containing material, or other material. This post-lithography processing may overcome shortfalls of known lithography, especially at the nanometer scale, such as for features having minimum dimensions in the range of 2 nm to 100 nm. The embodiments are not limited in this context.

Various embodiments are related to lithographic patterning and subsequent etching of patterned features used to fabricate features in a substrate, such as a device feature or group of features including an integrated circuit. The techniques disclosed herein in particular address problems associated with fabricating smaller patterned features where the patterned features may be more closely packed than in arrangements achievable through optical lithography alone. Various embodiments also address problems associated with pattern positioning and registration.

The present embodiments provide improvements over known techniques such as directional deposition, photoresist trim, focused ion beam modification, shrink etch, and tapered etch during etch of mask. In the latter technique, a feature may shrink in all directions. Notably, if a feature is asymmetric, the shrink is greater in the longer dimension.

In accordance with various embodiments a multiple operation process includes a deposition operation, such as a conformal deposition operation, where the deposition operation is performed on lithographically defined features, referred to herein as a "surface feature." This deposition operation may be performed on a developed photoresist feature. or alternatively on a feature formed in an etched film making up part or all of a hardmask, where the hardmask will eventually define the feature in the target material. Alternatively, the surface feature may comprise a final material in a substrate, where the final material is not subsequently removed.

In a subsequent operation, a directed etch including an ion exposure may be performed to etch at least a portion of the surface feature in a manner achieving one of the following: (a) a feature reduced in dimension along a first direction while not reduced in dimension along a second direction orthogonal to the first direction; (b) a new feature where the new feature is reduced in dimension in a first direction and is longer in dimension than the original surface feature in the second direction orthogonal to the first direction; (c) a feature shifted in position relative to its original position. As used herein the term "dimension" may refer to a length, width, depth or height of a feature such as a surface feature along a given direction. In various embodiments, the surface feature may be reduced in size in addition to being shifted from an original position. According to some embodiments, the material deposited in the deposition operation may be a first material different to the second material used as the mask material, i.e., the patterned feature material before processing.

One advantage to these embodiments is realized where an etch having selectivity to just the deposited material can be taken advantage of, while the original mask material of the surface feature serves as an etch stop. This selectivity can help improve within-wafer uniformity and local critical dimension uniformity (LCDU) of the patterned features. In other embodiments, the material deposited in the deposition operation may be the same as the mask material (substrate feature material before processing). This latter approach avoids complications during the final etch transfer to the target layer when the mask is composed of more than one material.

In still additional embodiments, the deposition process may be controllably varied across a wafer (substrate) using techniques available in a deposition chamber used to perform the selective deposition. This variation may achieve controllably variable changes to the dimensions of targeted features. For example, multi-zone heating across different portions of a substrate may achieve this result. In a subsequent operation, if a uniform etch is performed, local overlay error or variation in critical dimension (CD) may be reduced or eliminated by the intervening selective deposition operation.

FIGS. 1A-1D depict one example of processing a substrate such as a device structure according to various embodiments of the disclosure. In FIG. 1A there is shown a side cross-sectional view of a substrate 100 including a surface feature in the form of a cavity 102. In various embodiments, the cavity 102 may be a lithographically patterned feature formed by a known technique. The substrate 100 includes a substrate base 104, where the substrate base 104 may be composed of a first material. As noted in some examples, the substrate base 104 may be a hard mask material, a material such as $SiO_2$, or anti-reflective coating (ARC). Examples of known ARC materials may include silicon, carbon, or other combination of materials. The embodiments are not limited in this context. The substrate 100 may be patterned by known lithographic techniques to form the cavity 102. As shown in FIG. 1C, presenting a plan view, the cavity 102 may have a rectangular shape such as appropriate for a contact or via. The illustration in FIG. 1C is for purposes of clarification, and the cavity may assume any shape including curved shapes, or complex shapes in other embodiments. In accordance with various embodiments, a layer 106 may be deposited on the substrate base 104, where the layer 106 is also deposited within the cavity 102 and coats the cavity 102. In some embodiments the layer 106 may be deposited in a conformal manner so vertical surfaces (parallel to the Z-axis) as well as horizontal surfaces (parallel to the X-Y plane) are coated. In various embodiments, the layer thickness of layer 106 may be chosen so the layer thickness is less than approximately half of the smallest dimension (along the X-axis). The embodiments are not limited in this context. The layer 106 may be deposited by chemical vapor deposition (CVD), physical vapor deposition (PVD), atomic layer deposition (ALD), or other technique. The embodiments are not limited in this context. The layer 106 may comprise a second material different from the first material of the substrate base 104, or the layer 106 may comprise a same material as the first material of the substrate 104. For example, the layer 106 may be SiN, $SiO_2$, SiARC, TiN. To name just one example where the material of layer 106 differs from the substrate base 104, the layer may be SiN while the base is $SiO_2$. Such a combination, among others, allows the substrate base 104 to act as an etch stop for etching of layer 106 given the appropriate etch chemistry where SiN is etched selectively with respect to $SiO_2$. As an example, the cavity 102 may have dimensions of 10 nm, 20 nm, or 50 nm, while the thickness of the layer 106 is less than 5 nm, 10 nm, or 25 nm, respectively.

According to various embodiments, in a subsequent operation, directional ions, shown as ions 110, may be directed to the substrate 100 in an ion exposure as shown in FIG. 1A. The ions 110 may be directed at an angle of incidence forming a non-zero angle (θ) with respect to a perpendicular 120 to the substrate plane P. According to various embodiments, the angle θ, may vary between 5 degrees and 85 degrees. The embodiments are not limited in this context.

The ions 110 may accordingly strike at least one sidewall, in this case shown as sidewall 108. In various embodiments, the ions 110 may be provided in an ion exposure including a reactive mixture, where the reactive mixture etches the layer material of layer 106. The reactive mixture may be effective to volatilize layer material of layer 106 so material is evacuated and does not redeposit on other portions of the substrate 100 or cavity 102, as in known reactive ion processes. Etching of the layer material of layer 106 may in particular occur in regions of the substrate 100 impacted by the ions 110 Various embodiments extend to the use of a broad array of gas mixtures used for conventional reactive ion etching (RIE) processing. Thus, in addition to providing ions to a substrate at a chosen angle(s) of incidence, the substrate 100 is simultaneously exposed to reactive species, where the reactive species, together with the incident ions, generate reactive etching of at least the layer 106 of the substrate. One chemical system commonly used in the industry for RIE processing is $CH_3F$ mixed with $O_2$. This chemical system represents a known system for selectively etching SiN with respect to $SiO_2$ or Si. Another example is the use of $CF_4$ or $C_4F_8$ for etching $SiO_2$. A further example is the use of $Cl_2$ based chemistry for etching TiN. In other embodiments, any known RIE etch recipes may be applied for etching the layer 106 according to the composition of layer 106 and the composition of substrate base 104. The use of this chemical system in RIE processing leads to two competing mechanisms taking place on the surfaces of all materials on a substrate subjected to the RIE plasma. The first mechanism is etching of the surfaces of the substrate, while the second mechanism is deposition of a carbon-based polymer on substrate surfaces. Under certain process conditions polymer deposition may be useful as the dominant mechanism at the substrate surface when not subject to ion bombardment. Notably, energetic ion bombardment by species extracted from the RIE plasma can break apart the polymer and produce dangling bonds at the material surface, causing etching of the surface to become the dominant mechanism. Many other chemical systems may be used as needed to provide a reactive ion etching process according to the material to be reactively etched, as will be appreciated by those of skill in the art.

In the operation generally depicted in FIG. 1A, the substrate 100 may be exposed to reactive neutral species 124, where the reactive neutral species are derived from precursor gas composition used to generate the RIE plasma. The reactive neutral species 124 may arrive isotropically to the substrate 100, where every portion of the different exposed surfaces of the substrate 100 are impacted by the reactive neutral species 124, as shown in FIG. 1A. Notably, the present embodiments harness the principles of known RIE processing where etching of a given surface is enhanced in the presence of ions. Notably, in accordance with the present embodiments, etching may take place just in regions of the substrate 100 impacted by the directional ions, i.e., in regions impacted by the ions 110, while leaving other surfaces unetched.

Figure 9B:
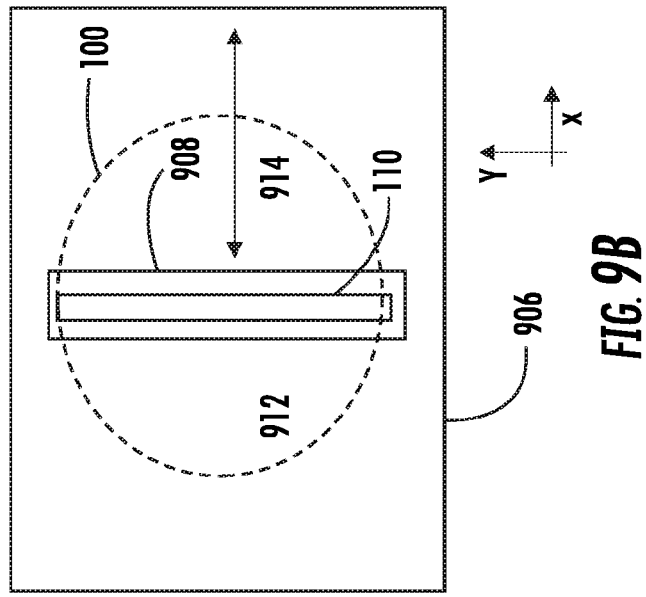
FIG. 9B depicts details of an exemplary extraction plate according to embodiments of the disclosure.
Figure 9A:
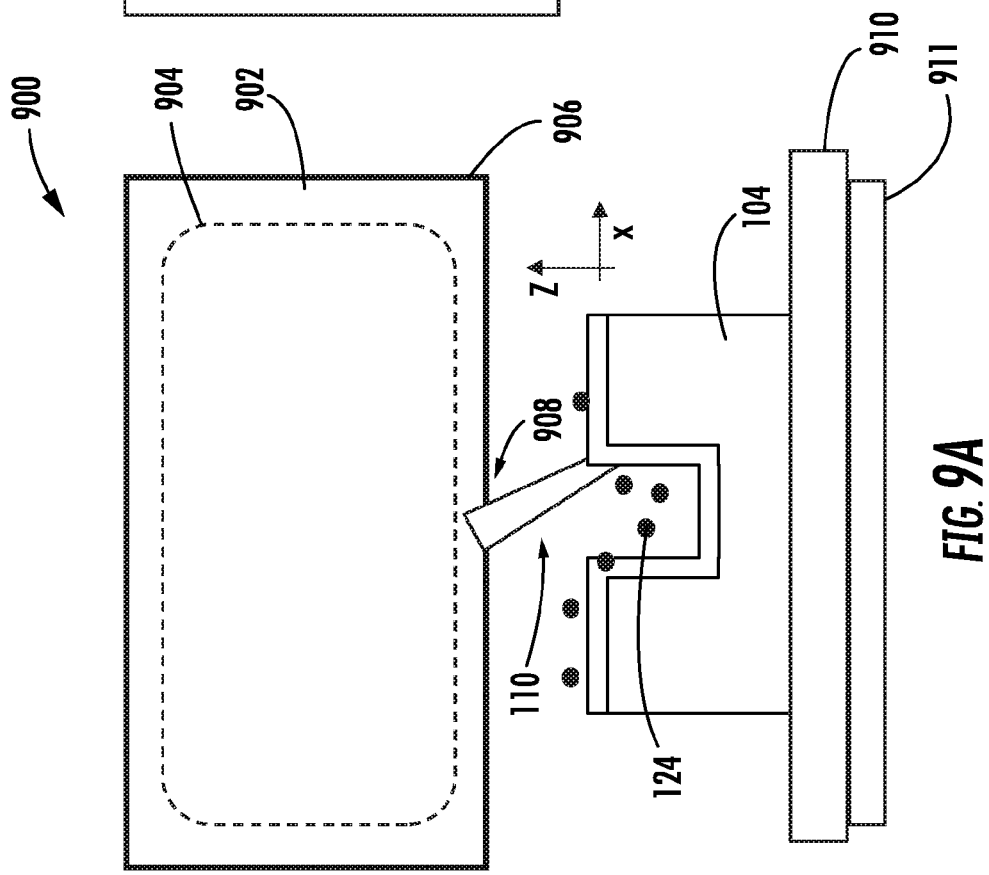
FIG. 9A illustrates an exemplary processing apparatus according to embodiments of the disclosure.

Turning now to FIG. 9A an exemplary processing apparatus, shown as processing apparatus 900, is illustrated, for providing an ion exposure as also illustrated in FIG. 1A. The processing apparatus 900 may be a known compact plasma processing system generating an ion beam shown as the ions 110. The ion beam may be extracted from a plasma 904 generated in a plasma chamber 902 by any known technique. The processing apparatus 900 may include an extraction plate 906 having an extraction aperture 908, where the ions 110 are extracted as an ion beam from the plasma 904 and directed to the substrate 100. As shown in FIG. 9B, the extraction aperture may be elongated along the Y-axis, providing a ribbon ion beam extending, for example, over an entire substrate along the direction parallel to the Y-axis. In various embodiments, the substrate 100 may be disposed on a substrate holder 910 and scanned along the X-axis to provide coverage at different regions of the substrate 100 or over the entirety of the substrate. In other embodiments, the extraction aperture 908 may have a different shape such as a square or circular shape.

In some embodiments, the plasma chamber 902 may also serve as a deposition process chamber to provide material for depositing on the substrate 100 in the deposition operation preceding etching. The substrate holder 910 may further include a heater assembly 911 for selectively heating the substrate 100 to different temperatures in different regions within the X-Y plane for selectively changing the amount of depositing material as discussed above.

During an ion exposure, reactive species may be provided or created in the plasma chamber 902 and may also impinge upon the substrate 100. While various non-ionized reactive species may impinge upon all surfaces of substrate 100 including different surfaces in cavity 102, etching may take place in areas impacted by the ions 110, as in known RIE processes, while little or no etching takes place in regions not impacted by ions 110. Thus, referring to FIG. 1C discussed below, a first portion 112 of a given surface feature such as cavity 102 impacted by the ions 110 may be etched at a first rate, while a second portion 114 of cavity 102 not impacted by ions is etched at a second rate less than the first rate. In some examples, the second rate may be zero or may be much less than the first rate.

As a result, as shown in FIGS. 1B and 1D, selective etching of the deposited layer, layer 106, may take place along the right sidewall as shown in FIG. 1B, shown as sidewall 108. The result of the deposition process for depositing layer 106 and selective directional etching of a portion of layer 106 in cavity 102, is the reduction in width of cavity 102 from width W1 to width W2 along the x-axis, as well as a reduction in length along the X-axis. As further shown in FIG. 1C, the ions 110 may be directed along a first direction with respect to the X-Y plane, such as along the X-axis. In this manner the first portion 112 may be the region of the cavity 102 lying along the right sidewall parallel to the Y-axis, since this region faces the ions 110 and is perpendicular to the direction of ions 110, and accordingly is disposed to intercept the ions 110. The second portion 114 may be the region of the cavity 102 lying along sidewalls parallel to the X-axis since these regions may receive little or no impact as ions travel parallel to the surface of these regions. The second portion 114 may also extend to the regions of the cavity 102 along left sidewall as shown in FIG. 1C, since this region is shadowed from the ions 110. Because just the layer 106 along the right sidewall is removed due to direction of ions 110 (see also FIG. 1C for the orientation of ions 110 within the X-Y plane), the reduction in width of cavity 102 from W1 to W2 along the direction parallel to X-axis may correspond to the thickness of layer 106 in this example, while the reduction in length of cavity 102 along the direction parallel to the Y-axis from L1 to L2 corresponds to twice the thickness of layer 106.

In various embodiments, the ions 110 may be directed in an exposure where reactive etching of layer 106 is selective with respect to etching of substrate base 104, where the substrate base 104 is a different material than material of layer 106. For example, layer 106 may be a photoresist while substrate base 104 is an oxide material. Accordingly, etching may cease of decrease drastically once layer 106 is removed from sidewall 108.

Accordingly, the multiple operation process outlined in FIGS. 1A-1D affords the ability to selectively change the dimensions of the cavity 102, for example, where a first dimension is selectively altered with respect to a second dimension, e.g., where the dimension along the Y-axis is changed to a different extent as compared to the dimension along the X-axis.

FIGS. 2A-2D depict another example of processing of a substrate according to embodiments of the disclosure. In the example shown, the conventions of FIGS. 1A-1D may apply while like reference numbers refer to similar or the same entities. In FIGS. 2A-2D there is shown a conformal deposition process, where the conformal deposition process may form an initial operation to be followed a directional etch process, such as depicted in FIGS. 3A-3G discussed below. In FIGS. 2A and 2B a substrate 200 is provided having a cavity 202, in this case of circular shape, within a base 204. In FIGS. 2C and 2D a layer 206 is deposited as generally described above with respect to layer 106. The deposition of the layer 206 may have the effect of reducing the diameter of cavity 202 by from W1 to W2 by an amount equal to twice the thickness of layer 206 as shown.

FIGS. 3A-3G depict processing of a device structure according to further embodiments of the disclosure. For clarity, in the figures to follow, the reactive neutral species 124 are not shown. In FIG. 3A and FIG. 3B there is shown the substrate 200 after deposition of the layer 206. Turning now to FIG. 3C and FIG. 3D there is shown an example of selective etching of the layer 106, where the ions 210 form trajectories parallel to the Y-axis and are directed to surfaces of the cavity 202 generally oriented along the X-axis, including opposite sidewall portions, while not necessarily parallel to the Y-axis. In this example, the ions 210 travel parallel to the Y-axis and accordingly do not impact the layer 206 in regions generally oriented along the Y-axis, while impacting regions of layer 206 more oriented parallel to the X-axis. Accordingly, the resulting structure has no material of layer 206 along the vertical cut (parallel to the Y-axis) shown in FIG. 3C, while the layer 206 is preserved at least in part in portions of the sidewalls of cavity 202 lying along the horizontal cut. In different embodiments, depending upon the angle of incidence θ of ions 210, the width of cavity 202 and height of cavity 202 (along the Z-axis), the ions 210 may or may not impact the bottom of cavity 202. In the example of FIG. 3D and FIG. 3F the ions 210 do not impact the bottom of cavity 202, leaving layer 206 intact, while in the example of FIG. 3E and FIG. 3G, ions 210 do impact the bottom surface of cavity, removing the layer 206. As a result of the operations of FIGS. 2-3 the shape and size of cavity 202 is changed from a circular shape to an elongated shape, such as an oval shape or elliptical shape as shown in FIG. 3C.

In the FIGS. 4A to 8C to follow directional ion etching processes are depicted in plan view. Notably in these depictions, the trajectories of ions form a non-zero angle with respect to the perpendicular 120 as illustrate in FIG. 1A. In the example of FIG. 4A and FIG. 4B the operations depicted in FIG. 2 and FIG. 3 may be extended wherein etching using directional ions along the directions shown in FIGS. 3D and 3F is continued after layer 206 is removed. In these embodiments, the etching species used to etch layer 206, such as ions 210 in combination with other reactive species, may also be effective to etch the base 204, where the base 204 may be made of a base material, where the base material is the same material or a different material from layer 206. As shown in FIG. 4B, a more elongated oval shape is formed having greater a dimension than the original dimension of cavity 202 along the Y-axis and shorter dimension along the X-axis as opposed to the original dimension. In some examples the greater dimension of an elongated shape may be twice the shorter dimension, or five times the shorter dimension. The embodiments are not limited in this context.

FIGS. 5A-5C show processing of a device structure according to additional embodiments of the disclosure. In this example a substrate 500 having a base 504 is provided with a trench 502 elongated along the X-axis and having a racetrack shape. In FIG. 5A, the structure is shown after a deposition process is performed to deposit a layer 506 within the trench 502. The length of the trench 502 has been reduced along the X-axis from an original length L1 by an amount equal to 2 times the thickness of the layer 506 as shown by L2. The width along the Y axis of trench 502 has been reduced by a similar amount from an original width W1 to W2. As shown in FIG. 5B, the trench 502 may be etched by directing ions 503 toward endwalls 508 and at a non-zero angle of incidence θ with respect to a perpendicular to a substrate plane of base 504 (see FIG. 1A for further definition of θ). As a result, layer 506 may be removed along the endwalls 508. As a result of the deposition of layer 506 and the direction reactive etching of trench 502 the trench width may be selectively reduced along the Y-axis to W2 while restoring the length of the trench 502 along the X-axis to the original length L1, since the layer 506 remains just along the portions of the trench 502 lying parallel to the ions 503. To facilitate restoration of the length of the trench 502 to its original length L1 before deposition of layer 506, etch chemistry is used providing a high degree of selectivity of etching material of layer 506 with respect to the material of base 504. In this manner the etching may cease when the base material of base 504 is encountered.

In the example of FIG. 5C, the structure of FIG. 5A may be etched using ions 505, where the ions 505 are directed in a similar manner as the process of FIG. 5B to the endwalls 508. In this example, the etching process using ions 505 may be continued to etch material within base 504 so the length L3 of the trench 502 is greater than its original length L1 before deposition of layer 506. In some variants, the etch composition of species used during ion etching of base 504 may be changed from the etch composition used to etch the layer 506. Alternatively, the etch composition chosen to etch layer 506 and base 504 may be the same composition and may be relatively non-selective where the etch rate of layer 506 is similar to the etch rate of base 504.

FIGS. 6A-6F illustrate processing of a substrate according to still other embodiments of the disclosure. In this example, in FIG. 6A the trench 502 is again shown after formation of the layer 506, reducing the original trench size including the length along the X-axis from L1 to L2. In FIG. 6B, ions 603 are directed along trajectories parallel to the X-axis just to the right endwall, shown also as endwall 508, resulting in the trench 502 having reduced dimensions along three sides, while retaining the original position of the right endwall before deposition of layer 506. In FIG. 6C ions 605 are directed toward the right sidewall to continue etching of the trench 502, as generally described above with respect to FIG. 5C, except in this case the ions 605 are just directed to the right as shown. This etching process allows for formation of a trench 502 having a narrower width W2 along the Y-axis, and shifted position (location) with respect to the original trench location shown in FIG. 6A. Depending upon the extent of etching performed in the operation of FIG. 6C, the length of the trench along the X-axis may be greater than L1 of the original trench, or may be the same as L1, as depicted in FIG. 6C. Accordingly, FIG. 6C provides a specific example where a surface feature location, in this case a trench location with respect to a position along the X-axis, is shifted, while the trench is also selectively narrowed along the Y-axis.

Turning to FIG. 6D there is shown a substrate 610 having a cavity of circular shape after deposition of a layer 616. In FIG. 6E a resulting shape of the cavity 612 is shown when ions 614 are directed just toward the upper (in FIG. 6E) sidewall 615, resulting in a cavity 612 where the position of the upper sidewall region is the same as before deposition as layer 616, while other regions of cavity 612 are reduced in size, resulting in a more oval shape. As shown in FIG. 6F, further etching by ions 618 may be performed along the same direction as ions 614, where the ions 618 may be similar to or different from the ions 614. This further etching results in etching into base 604 along the same direction as in FIG. 6E, and may result in a more elongated oval shape.

Figure 7A:
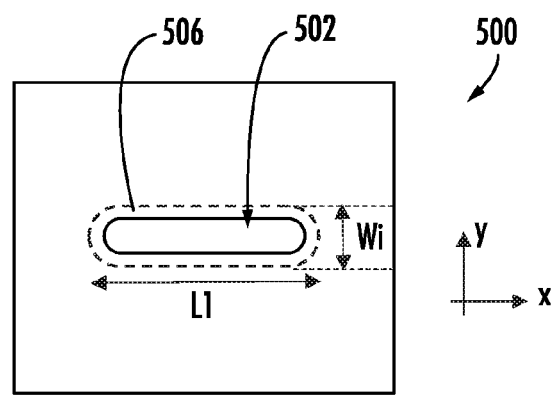
FIG. 7A to FIG. 7C illustrate another example of processing a device according to some embodiments of the disclosure.
Figure 7B:
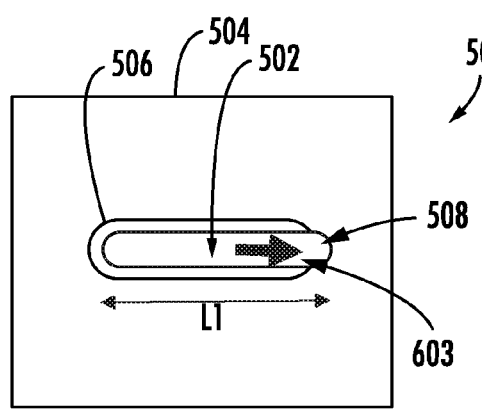
Figure 7C:
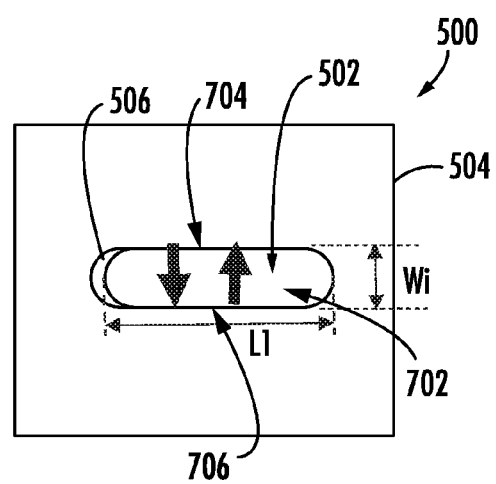

Turning now to FIG. 7A and FIG. 7B there is shown a further example of processing a cavity, where the trench 502 is formed as described above by depositing a layer 506. Subsequently, ions such as the ions 603, or a combination of ions 603 and ions 605, may be directed along the X-axis to etch just the right endwall, shown as endwall 508 in FIG. 7B. By proper selection of etching conditions and etching time, the resulting trench, shown as trench 502, may have the same length, shown as L1, as before deposition of layer 506, while the center of the trench 502 along the X-axis in FIG. 7B is shifted to the right with respect to trench 502 of FIG. 7A. Furthermore, in a second directional etching operation shown in FIG. 7C, ions 702 may be directed parallel to the Y-axis to the top edge 704 and bottom edge 706 of the trench 502. In some embodiments, the material of layer 506 may differ from the material of base 504 wherein etching by the ions 702 of the layer 506 is highly selective with respect to the etching of base 504. For example, ions 702 may be provided in a reactive ion etch process for etching layer 506 at a rate twice as fast as the etching of base 504, or five times as fast, 10 times as fast, or 20 times as fast. The embodiments are not limited in this context. In this manner, the layer 506 may be completely removed from the bottom edge 706 and top edge 704, while little or no material from base 504 is removed from these edges. This etching allows the original trench width W1 to be restored, corresponding to the trench width before deposition of layer 506. A net result of these processes is shown in FIG. 7C, where the trench 502 is shifted to the right from an original trench location before deposition of layer 506, as shown by the dashed curve in FIG. 7A, while the original dimensions of the trench 502 are preserved. In various embodiments, the cavity location for any cavity shape may be shifted from a first cavity location to a second cavity location in a like manner to the operations of FIGS. 7A-7C while preserving the original cavity dimensions.

FIGS. 8A-8G another example of processing a substrate according to some additional embodiments of the disclosure.

In the example of FIG. 8A and FIG. 8D, a substrate 800 is provided with a pillar 802 extending above a base 804. The pillar 802 may, but need not be, a different material than the material of base 804. In FIG. 8B and FIG. 8E a layer 806 is deposited, as generally described above. In FIG. 8C ions 812 are directed toward the pillar 802 in two opposite directions, where the opposite directions lie parallel to the Y-axis as shown, resulting in removal of layer 806 from regions generally more aligned along the X-axis, as further shown in the cut sections of FIG. 8F and FIG. 8G. Accordingly, the original diameter D1 is increased to a diameter D2 along the X-axis, as shown in FIG. 8D, while the original diameter D1 may be maintained along the X-axis, as shown in FIG. 8B. This directional etching allows the originally circular shape of the pillar 802 to be transformed to an oval shape as illustrate in FIG. 8C.

In further embodiments, directional etching of ions may be performed by rotating a substrate within the X-Y plane to any desired angle. Thus, a trench feature may be oriented with its long axis at a 45 degree angle with respect to the Y-axis while a ribbon beam directed to the trench feature has its axis oriented along the Y-axis as in FIG. 9B.

In additional embodiments, an operation involving deposition of a layer on a surface feature followed by selective directional etching of the surface feature as described above, may be repeated in an iterative fashion. A given cycle may be composed of deposition of a layer followed by etching of the surface feature including the deposited layer along a given direction. This given cycle may be repeated a desired number of times to adjust the dimension of a feature selectively along a given direction, to adjust the shape, or adjust the position, for example.

In additional embodiments, by scanning a substrate with respect to an ion beam such as along the X-axis as generally shown in FIG. 9B, the possibility is afforded to vary a directed etch across the substrate to achieve location-specific directional selectivity of etching, so features within a certain region, such as region 912 of the substrate may be altered to one extent while features in another region, such as region 914, are not altered or are altered to a different extent or in a different fashion. For example, an ion beam, shown as ions 110 may be present when region 912 is under extraction aperture 908, while the ion beam is extinguished when the region 914 is under extraction aperture 908.

The present embodiments provide various advantages over conventional processing to define features in a substrate. Currently, there are no known techniques able to achieve what is described in these embodiments, in particular over a full wafer in a manufacturing environment. Several problems may be solved with these embodiments including a first advantage of being able to shift a surface feature within a substrate in a desired direction and in a desired amount. The present embodiments also proved the advantage where a feature may be shifted and the original feature shape or dimensions may be preserved or changed. Another advantage of the present embodiments is the ability to generate otherwise unobtainable feature dimensions and shapes. Further advantages include the ability to provide for overlay correction, providing for overlay margin improvement, providing tip-to-tip separation reduction between adjacent features to dimensions not otherwise obtainable, contact resistance reduction in structures formed according to the present embodiments, increase in pattern density, and elimination of a cut-mask operation.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are in the tended to fall within the scope of the present disclosure. Furthermore, the present disclosure has been described herein in the context of a particular implementation in a particular environment for a particular purpose, while those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

What is claimed is:

1. A method, comprising:
 providing a surface feature on a substrate, the surface feature comprising a feature shape a feature location, and a dimension along a first direction within a substrate plane;
 depositing a layer comprising a layer material on the surface feature; and
 directing ions in an ion exposure at an angle of incidence toward the substrate, the angle of incidence forming a non-zero angle with respect to a perpendicular to the substrate plane,
 wherein the ion exposure comprises the ions and reactive neutral species, the ion exposure reactively etching the layer material, wherein the ions impact the layer on a first sidewall portion of the surface feature, the first sidewall portion extending perpendicularly to the substrate plane, and do not impact the layer on a second sidewall portion of the surface feature, the second sidewall portion extending perpendicularly to the substrate plane and along the first direction, and wherein an altered surface feature is generated, the altered surface feature differing from the surface feature in at least one of: the dimension along the first direction, the feature shape, or the feature location.

2. The method of claim 1, wherein the substrate feature comprises a cavity, the cavity comprising a first dimension along the first direction and a second dimension along a second direction perpendicular to the first direction, and wherein the depositing the layer comprises performing a shrink of the cavity wherein the first dimension and second dimension are reduced.

3. The method of claim 2, wherein the ion exposure comprises etching the layer along the first direction a first amount and etching the layer along the second direction a second amount, the second amount being less than the first amount.

4. The method of claim 3, wherein the cavity comprises a circular shape before the ion exposure and comprises an elongated shape after the ion exposure.

5. The method of claim 3, wherein the layer material is removed from a bottom surface of the cavity after the etching.

6. The method of claim 3, wherein the cavity is formed within a substrate material before the ion exposure, and wherein the ion exposure comprises etching the substrate material along the first direction to form an elongated shape, wherein the elongated shape comprises a third dimension along the first direction, the third dimension being greater than the first dimension.

7. The method of claim 3, wherein the cavity comprises a trench before the depositing the layer, wherein the first dimension is greater than the second dimension, and wherein after the depositing the layer and after the ion exposure, the trench comprises a third dimension along the second direction, the third dimension being less than the first dimension, and further comprises the first dimension along the first direction.

8. The method of claim 3, wherein the cavity comprises a trench before the depositing the layer, wherein the first dimension is greater than the second dimension, and wherein after the depositing the layer and after the ion exposure, the trench comprises a third dimension along the second direction, the third dimension being less than the first dimension, and further comprises a fourth dimension along the first direction, the fourth dimension being greater than the first dimension.

9. The method of claim 3, wherein a location of the cavity is shifted from a first location within the substrate before the depositing the layer to a second location within the substrate after the ion exposure, wherein the first sidewall portion comprises a cavity sidewall of the cavity, and wherein the location of the cavity is shifted by etching the cavity sidewall along the first direction.

10. The method of claim 9, wherein after the depositing the layer and the ion exposure a dimension of the cavity is reduced along the second direction, and wherein the first dimension along the first direction is not altered.

11. The method of claim 9, wherein after the depositing the layer and the ion exposure a dimension of the cavity is reduced along the second direction, and wherein the first dimension along the first direction is increased.

12. The method of claim 1, wherein the surface feature extends above the substrate plane, wherein before the depositing the layer the surface feature comprises a first feature dimension along the first direction and a second feature dimension along a second direction perpendicular to the first direction, and wherein the depositing the layer comprises increasing the first feature dimension to a third feature dimension and increasing the second feature dimension to a fourth feature dimension, and wherein the ion exposure comprises decreasing the third feature dimension to a fifth feature dimension less than the fourth feature dimension.

13. The method of claim 1, wherein the ions are directed as a ribbon ion beam and have trajectories parallel to the first direction.

14. The method of claim 1, the depositing the layer comprising selectively depositing the layer on the substrate, wherein the layer comprises a first thickness over a first region of the substrate and comprises a second thickness different from the first thickness over a second region of the substrate, wherein after the depositing the layer, a dimension of the surface feature along the first direction is altered by a first amount in the first region and by a second amount in the second region.

15. A method of processing a substrate, comprising:
 providing a cavity in the substrate, the cavity having a first dimension along a first direction within a substrate plane and a second dimension along a second direction within the substrate plane, the second direction being perpendicular to the first direction;
 depositing a layer comprising a layer material within the cavity; and
 directing ions in an ion exposure at an angle of incidence toward the substrate, the angle of incidence forming a non-zero angle with respect to a perpendicular to the substrate plane,
 wherein the ion exposure comprises the ions and reactive neutral species, the ion exposure reactively etching the layer material, wherein the ions impact a first sidewall portion of the cavity, the first sidewall portion extending perpendicularly to the substrate plane, and do not impact a second sidewall portion of the cavity, the second sidewall portion extending perpendicularly to the substrate plane and along the first direction, and wherein the first dimension is selectively altered with respect to the second dimension.

16. The method of claim 15, wherein the first dimension is reduced while the second dimension is not reduced.

17. A method of processing a substrate, comprising:
providing a cavity in the substrate, the cavity disposed at a first cavity location within the substrate;
depositing a layer comprising a layer material within the cavity; and
directing ions in an ion exposure at an angle of incidence toward the substrate, the angle of incidence forming a non-zero angle with respect to a perpendicular to the substrate plane,
wherein the ion exposure comprises the ions and reactive neutral species, the ion exposure reactively etching the layer material, wherein the ions impact a first sidewall portion of the cavity, the first sidewall portion extending perpendicularly to the substrate plane, and do not impact a second portion of the cavity, the second sidewall portion extending perpendicularly to the substrate plane and along the first direction, and wherein the cavity is disposed at a second cavity location in the substrate after the ion exposure.

\* \* \* \* \*